United States Patent
Shafrir et al.

(10) Patent No.: US 8,522,116 B2
(45) Date of Patent: Aug. 27, 2013

(54) SYSTEMS AND METHODS FOR PERFORMING FORWARD ERROR CORRECTION

(75) Inventors: Oren Shafrir, Tel Aviv (IL); Erez Izenberg, Tel Aviv (IL); Erez Amit, Rehovot (IL); Dimitry Melts, Tel Aviv (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 218 days.

(21) Appl. No.: 13/191,945

(22) Filed: Jul. 27, 2011

(65) Prior Publication Data

US 2012/0036415 A1    Feb. 9, 2012

Related U.S. Application Data

(60) Provisional application No. 61/370,705, filed on Aug. 4, 2010.

(51) Int. Cl.
*H03M 13/00* (2006.01)

(52) U.S. Cl.
USPC ........................................... 714/776

(58) Field of Classification Search
USPC ................. 714/746, 751–752, 774–776, 785
See application file for complete search history.

(56) References Cited

U.S. PATENT DOCUMENTS

| | | | | |
|---|---|---|---|---|
| 6,480,976 B1 * | 11/2002 | Pan et al. | | 714/701 |
| 7,818,648 B2 * | 10/2010 | Haran | | 714/752 |
| 8,122,325 B2 * | 2/2012 | Effenberger | | 714/775 |
| 2011/0142437 A1 * | 6/2011 | Luo et al. | | 398/1 |

OTHER PUBLICATIONS

Zeng et al. 5Gb/s burst mode clock phase align with (64, 57) hamming codes for GPON applications, 2008, IEEE, p. 17-20.*
International Telecommunication Union, Transmission of Component-Coded Digital Television Signals for Contribution-Quality Applications at the Third Hierarchical Level of ITU-T Recommendation G.702, Sep. 1993, pp. 1-66, ITU Recommendation J.81.
International Telecommunication Union, Gigabit-Capable Passive Optical Networks (G-PON): Transmission Convergence Layer Specification, Mar. 2008, pp. 1-146, ITU Recommendation G.984.3.

* cited by examiner

*Primary Examiner* — Shelly A Chase

(57) ABSTRACT

In accordance with the teachings described herein, systems and methods are provided for performing forward error correction. A decoder for performing forward error correction for a frame in a data stream includes a state machine configured to determine if a code block within the frame received by the decoder is a complete code block or a partial code block, the frame including a plurality of code blocks. A decoding unit is configured to receive the code block, and, when the code block is a partial code block, to generate an output based on decoding the partial code block and an additional partial decoding result that is input to the decoding unit.

20 Claims, 9 Drawing Sheets

SYSTEMS AND METHODS FOR PERFORMING FORWARD ERROR CORRECTION

CROSS-REFERENCE TO RELATED APPLICATIONS

This application claims priority to and benefit from U.S. Provisional Patent Application No. 61/370,705, filed on Aug. 4, 2010, and entitled "Reed-Solomon Decoder For GPON Applications." The content of this provisional application is incorporated herein by reference in its entirety.

FIELD

The technology described in this patent document relates generally to error correction for data transmission. More particularly, systems and methods are disclosed for forward error correction for data transmission.

BACKGROUND

Forward error correction (FEC) is often used in communication systems, and is based on transmitting data in an encoded format. FEC is usually carried out by adding redundancy to original data for transmission using a predetermined algorithm. The redundancy to the original data allows a decoder to detect and correct transmission errors.

There are many examples of FEC codes, including a Reed-Soloman (RS) code. A RS code is a block error correction code, and is specified in the International Telecommunication Union standard ITU-T (Recommendation J.81). For example, an RS encoder receives original data in a predetermined block format and adds redundant bits to the original data to generate a code block (e.g., a code word). An RS decoder receives the encoded data and related parity check data and recovers the original data when a transmission error occurs.

The description above is presented as a general overview of related art in this field and should not be construed as an admission that any of the information it contains constitutes prior art against the present patent application.

SUMMARY

In accordance with the teachings described herein, systems and methods are provided for performing forward error correction for a frame in a data stream. An example decoder includes a state machine and a decoding unit. The state machine is configured to determine if a code block within the frame received by the decoder is a complete code block or a partial code block, the frame including a plurality of code blocks. The decoding unit is configured to receive the code block, and, when the code block is a partial code block, to generate an output based on decoding the partial code block and an additional partial decoding result that is input to the decoding unit.

As further examples, the decoding unit is further configured, when the code block is a complete code block, to generate an output based on decoding the complete code block. The decoding unit includes a plurality of stages, each stage corresponding to a term of a polynomial representing the code block. When the code block is determined to be a complete code block, the decoding unit is configured to input the code block to the plurality of stages starting at a beginning stage of the plurality of stages. When the code block is determined to be a partial code block, the decoding unit is configured to input the code block to the plurality of stages starting at an intermediate stage of the plurality of stages, the intermediate stage being determined based on a pre-determined structure of the code block.

As another example, the decoding unit includes a syndrome component and an error correction component. The syndrome component is configured to receive the code block, and to generate syndrome values of the code block, the syndrome component including a first plurality of stages, each of the first plurality of stages corresponding to a term of a polynomial representing the code block. The error correction component is configured to receive the syndrome values, and to determine whether the code block contains an error based on the syndrome values, the error correction component including a second plurality of stages, each of the second plurality of stages corresponding to a term of the polynomial representing the code block.

As further examples, when the code block is determined to be a complete code block, the syndrome component is configured to input the code block to the first plurality of stages starting at a beginning stage of the first plurality of stages. When the code block is determined to be a partial code block, the syndrome component is configured to input the code block to the first plurality of stages starting at an intermediate stage of the first plurality of stages, the intermediate stage being determined based on a pre-determined structure of the code block. When the code block is determined to be a complete code block, the error correction component is configured to input the syndrome values of the code block to the second plurality of stages starting at a beginning stage of the second plurality of stages. When the code block is determined to be a partial code block, the error correction component is configured to input the syndrome values of the code block to the second plurality of stages starting at an intermediate stage of the second plurality of stages, the intermediate stage being determined based on a pre-determined structure of the code block.

As additional examples, the decoding unit further includes a buffer configured to receive the syndrome values from the syndrome component when the code block is determined to be a partial code block. The error correction component is configured to receive the syndrome values directly from the syndrome component when the code block is determined to be a complete code block. The error correction component is configured to receive the syndrome values from the buffer after a predetermined delay when the code block is determined to be a partial code block. The state machine is further configured to determine if the code block is a complete code block or a partial code block based at least in part on a pre-determined structure of the frame and a location of the code block within the frame. The state machine is further configured to determine if the code block is a complete code block or a partial code block based at least in part on the number of bytes of original data for transmission contained in the code block. The code block is determined to be a complete code block when the code block contains 239 bytes of the original data for transmission, or to be a partial code block when the code block contains 104 bytes of the original data for transmission.

As another example, a method is provided for performing forward error correction for a frame of a data stream. The frame that includes a plurality of code blocks is received. For each of the plurality of the code blocks, whether a code block is a complete code block or a partial code block is determined using a state machine. The code block is decoded in a decoder based on the determination. When the code block is determined to be a partial code block, an output is generated based on decoding the partial code block and an additional partial decoding result that is input to the decoder.

As further examples, when the code block is determined to be a complete code block, an output is generated based on decoding the entire code block. Decoding the code block in the decoder based on the determination includes generating syndrome values for the code block, and performing error correction for the code block based on the generated syndrome values. When the code block is determined to be a partial code block, the error correction for the code block is performed after a predetermined delay. The determination of whether the code block is a complete code block or a partial code block is based at least in part on a pre-determined structure of the frame and a location of the code block within the frame.

DETAILED DESCRIPTION

Figure 1:
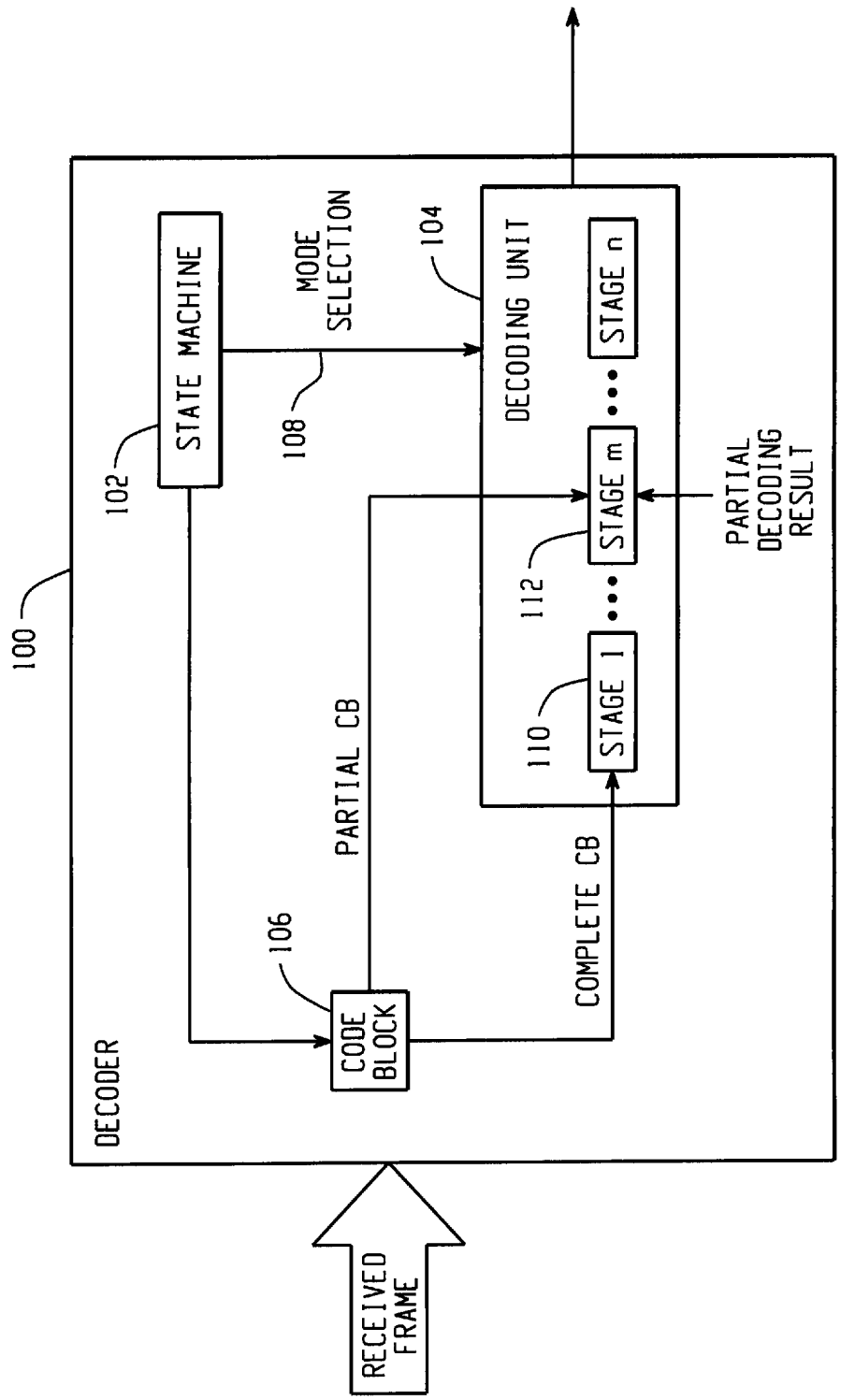
FIG. 1 is a diagram of an example decoder for performing forward error correction (FEC) on a data stream having frames with both complete and partial code blocks, in accordance with an embodiment of the disclosure.

FIG. 1 is a diagram of an example decoder 100 for performing forward error correction (FEC) on a data stream having frames with both complete and partial code blocks, in accordance with an embodiment of the disclosure. In certain types of communication systems, such as for example a Gigabit-capable passive optical network (GPON) and 10 Gigabit GPON, each frame of data is transmitted using a predetermined structure that includes a number of complete code blocks followed by a partial code block. The example decoder 100 depicted in FIG. 1 determines whether an incoming code block in a frame of data is either a complete code block or a partial code block, and based on this determination, selects an appropriate operating mode for a decoding unit.

Specifically, the decoder 100 depicted in FIG. 1 includes a state machine 102 and a decoding unit 104. In operation, the state machine 102 monitors incoming code blocks of a received frame and determines whether a particular incoming code block 106 is a complete code block or a partial code block based, for example, upon prior knowledge of a standardized structure of the frame and a location of the code block within the frame. Then, according to the determination, the state machine 102 outputs a mode selection signal 108 to the decoding unit 104 to select an operating mode for the decoding unit 104, and the incoming code block 106 is provided to the decoding unit 104, for example to an initial or to an intermediate processing stage in the decoding unit 104, so as to be suitably processed based on the determination.

In an embodiment, the decoding unit 104 includes a plurality of stages (e.g., "stage 1," ... "stage m," ... "stage n") for processing the incoming code block 106. If the mode selection signal 108 indicates that the incoming code block 106 is a complete code block, the decoding unit 104 enters into an operating mode for a complete code block, and inputs the code block 106 into the stages starting at an initial stage, stage 1 110, for decoding. On the other hand, if the mode selection signal 108 indicates that the incoming code block 106 is a partial code block, the decoding unit 104 enters into an operating mode for a partial code block, and inputs the code block 106 into the stages starting at an intermediate stage, stage m 112, for decoding. In accordance with an embodiment, when the code block 106 is a partial code block, it is provided to the intermediate stage m along with additional information, for example, a partial decoding result that would have been obtained following decoding of the partial code block at one or more initial stages such as stage 1 110. In some embodiments this is rendered possible because partial code blocks are "padded" in a uniform manner, e.g. with zeros, such that initial decoding of all partial code blocks at the initial stages of decoding unit 104 produces the same result. After processing the code block 106, the decoding unit 104 can be used to decode subsequent code blocks in the frame.

Figure 2:
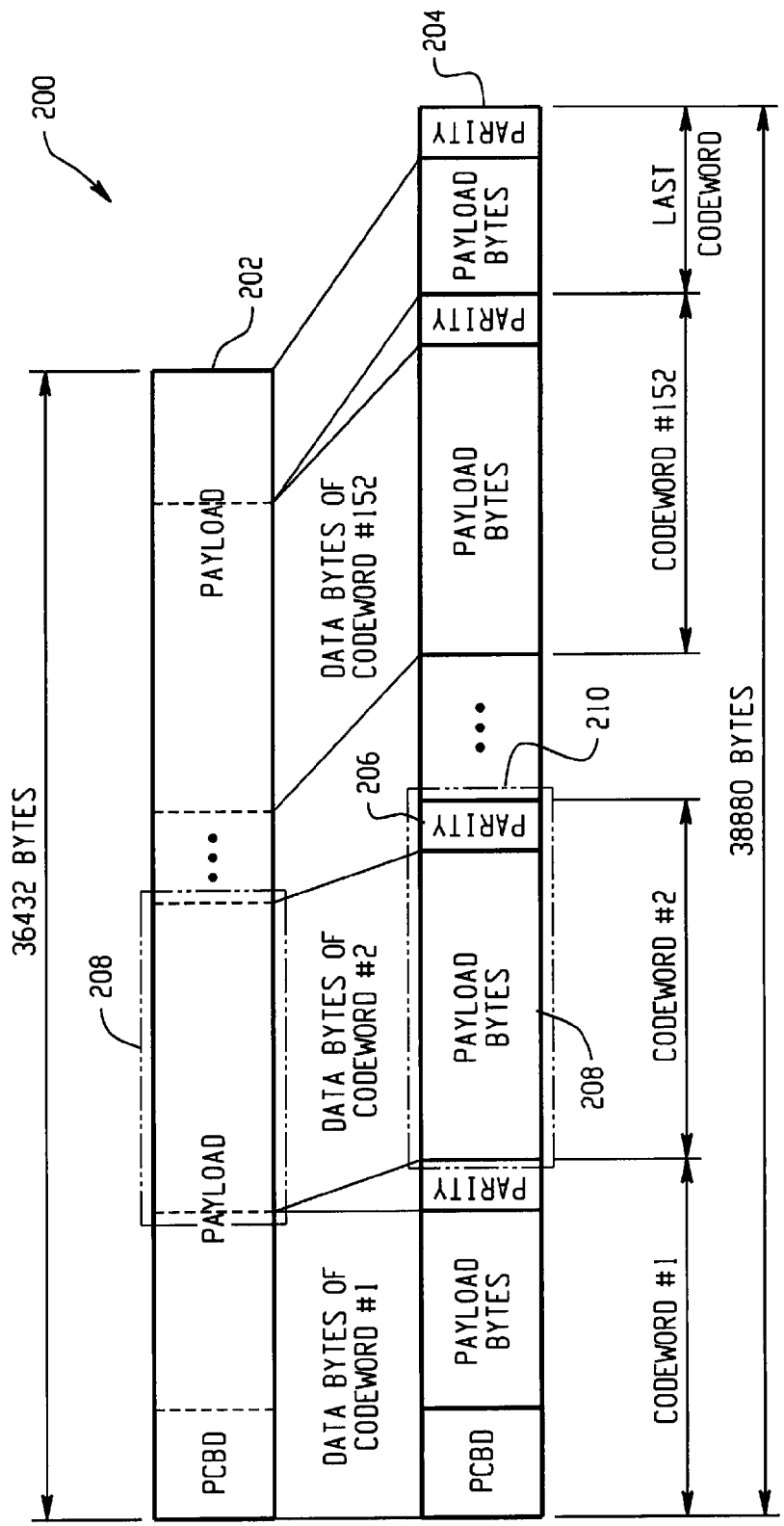
FIG. 2 illustrates an example of a GPON frame generated from original data in accordance with an embodiment of the disclosure.

FIG. 2 illustrates at 200 an example of a GPON frame generated from original data in accordance with an embodiment of the disclosure. The RS code is often used to add redundant bits (e.g. parity check data) to original data to generate encoded code blocks (e.g., codewords). Two frames are seen in FIG. 2, an original data frame 202, and a GPON frame 204. The original data frame 202 has a physical control block downstream (PCBD), and a plurality of original payload data blocks. The GPON frame 204 is generated by adding parity check data to data blocks of the original data frame 202. For example, parity check data 206 is appended to an original data block 208 in the data frame 202 to generate a code block 210 of the GPON frame 204. The GPON frame 204 usually has a standardized structure, and a fixed code block size. In an embodiment, using the RS code represented as RS(255, 239, 8), the GPON frame 204 includes 152 complete code blocks each having 239 bytes of original data and 16 bytes of parity check data, and one subsequent partial code block, positioned at the end of a GPON frame, having 104 bytes of original data and 16 bytes of parity check data.

Figure 3:
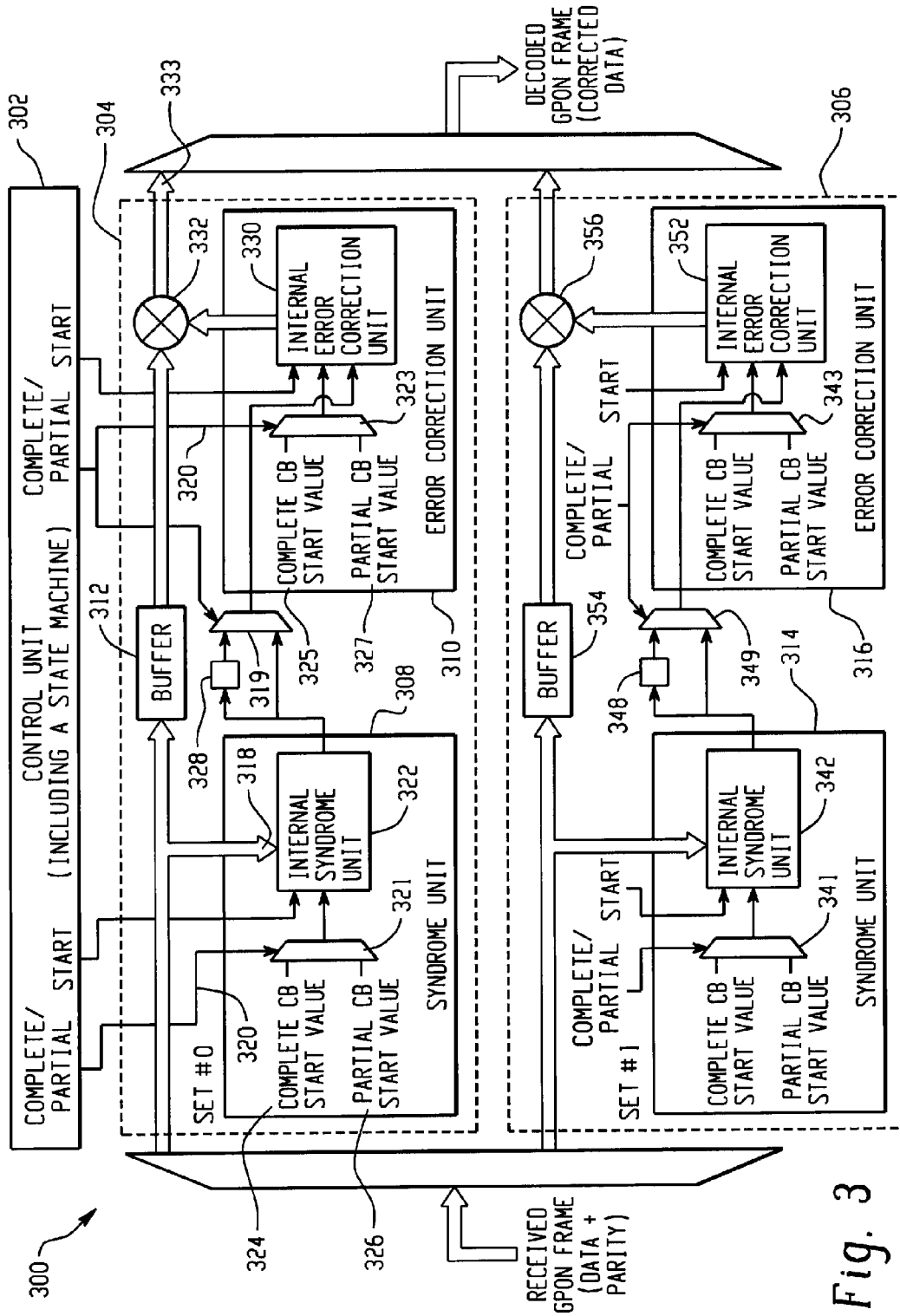
FIG. 3 is a diagram detailing an example decoder of FIG. 1 in accordance with an embodiment of the disclosure.

FIG. 3 is a diagram detailing an example decoder of FIG. 1 in accordance with an embodiment of the disclosure. As noted above with reference to FIG. 1, in accordance with an embodiment, a decoder determines whether an incoming code block in a GPON frame is either a complete code block or a partial code block, and based on this determination, selects an appropriate operating mode for a decoding unit to process the incoming code block.

The example decoder 300 includes a control unit 302, and two decoding units 304 and 306. The two decoding units 304 and 306 respectively process incoming code blocks alternately. In operation, a state machine contained in the control unit 302 monitors incoming code blocks of a received GPON frame and determines whether an incoming code block 318 is a complete code block or a partial code block. In an embodiment, determination of whether the incoming code block 318 is a complete code block or a partial code block is carried out based upon prior knowledge of a standardized structure of the received GPON frame and a location of the code block within the GPON frame. Then, according to the determination, the control unit 302 outputs a mode selection signal 320 for selecting an operating mode for either the decoding unit 304 or the decoding unit 306.

For example, when the decoding unit 304 is set to process the incoming code block 318, the mode selection signal 310 selects an operating mode for the decoding unit 304 which includes a syndrome unit 308, an error correction unit 310, and a partial code block buffer 328. The syndrome unit 308 is used for calculating syndrome values (i.e., roots of a generating polynomial) for the incoming code block 318. When the mode selection signal 320 indicates that the incoming code block 318 is a complete code block, the decoding unit 304 enters into an operating mode for a complete code block. In an embodiment, a multiplexer 321 receives the mode selection signal 320 indicative of a complete code block, and provides a complete code block start value 324 to an internal syndrome unit 322. Then, the internal syndrome unit 322 outputs syndrome values calculated for the incoming code block 318 to a multiplexer 319. In response to the mode selection signal 320 indicative of a complete code block, the multiplexer 319 provides the syndrome values calculated for the incoming code block 318 to the internal error correction unit 330 that is included in the error correction unit 310. In response to the mode selection signal 320, a multiplexer 323 provides a complete code block start value 325 to the internal error correction unit 330. Based upon the received syndrome values for the code block 318 and the complete code block start value 325, in the described scenario a complete code block, the internal error correction unit 330 performs error correction on the code block 318 when it is determined to contain errors. In an embodiment, the internal error correction unit 330 outputs error correction results for the code block 318 to an arithmetic component 332, such as an arithmetic combiner. The arithmetic component 332 additionally receives a copy of the initially input code block 318 from a buffer 312, and then generates an error corrected code block 333 which is output from the decoding unit 304.

On the other hand, in an embodiment, when the mode selection signal 320 indicates that the incoming code block 318 is a partial code block, the decoding unit 304 enters into a partial code block operating mode. In an embodiment, code block decoding in the internal syndrome unit 322 progresses through multiple stages. Decoding of a partial code block commences at an intermediate processing stage of the internal syndrome unit 322. The multiplexer 321 provides to the internal syndrome unit 322 a partial code block start value 326. In an embodiment, the partial code block start value 326, which is different from the complete code block start value 324, corresponds to a result of decoding a certain number of zeros as if the code block 318 had been initially padded with the zeros so as to synthesize a complete code block to be decoded. The internal syndrome unit 322 outputs the syndrome values calculated based on the code block 318 and the partial code block start value 326, to the partial code block buffer 328. After a predetermined delay, which, in an embodiment, corresponds to a reduced time for decoding the partial code block 318, the multiplexer 319 receives the syndrome values calculated for the code block 318 from the partial code block buffer 328, in response to the mode selection signal 320 indicative of a partial code block. Then, the multiplexer 319 outputs the syndrome values calculated for the code block 318 to the internal error correction unit 330. In response to the mode selection signal 320, the multiplexer 323 provides the partial code block start value 327 to the internal error correction unit 330. Based upon the received syndrome values for the code block 318 and the partial code block start value 327, in the described scenario of a partial code block, the internal error correction unit 330 performs error correction on the code block 318 when it is determined to contain errors. In an embodiment, the internal error correction unit 330 outputs error correction results for the code block 318 to an arithmetic component 332 for generating the error corrected code block 333.

Similar to the decoding unit 304, the decoding unit 306 includes a syndrome unit 314, an error correction unit 316, a partial code block buffer 348, and a multiplexer 349. The syndrome unit 314 includes a multiplexer 341 and an internal syndrome unit 342. The error correction unit 316 includes a multiplexer 343 and an internal syndrome unit 352. For example, when the decoding unit 306 is set to process the incoming code block 318, the operations of the decoding unit 306 is similar to what is described above with respect to the decoding unit 304.

Figure 4:
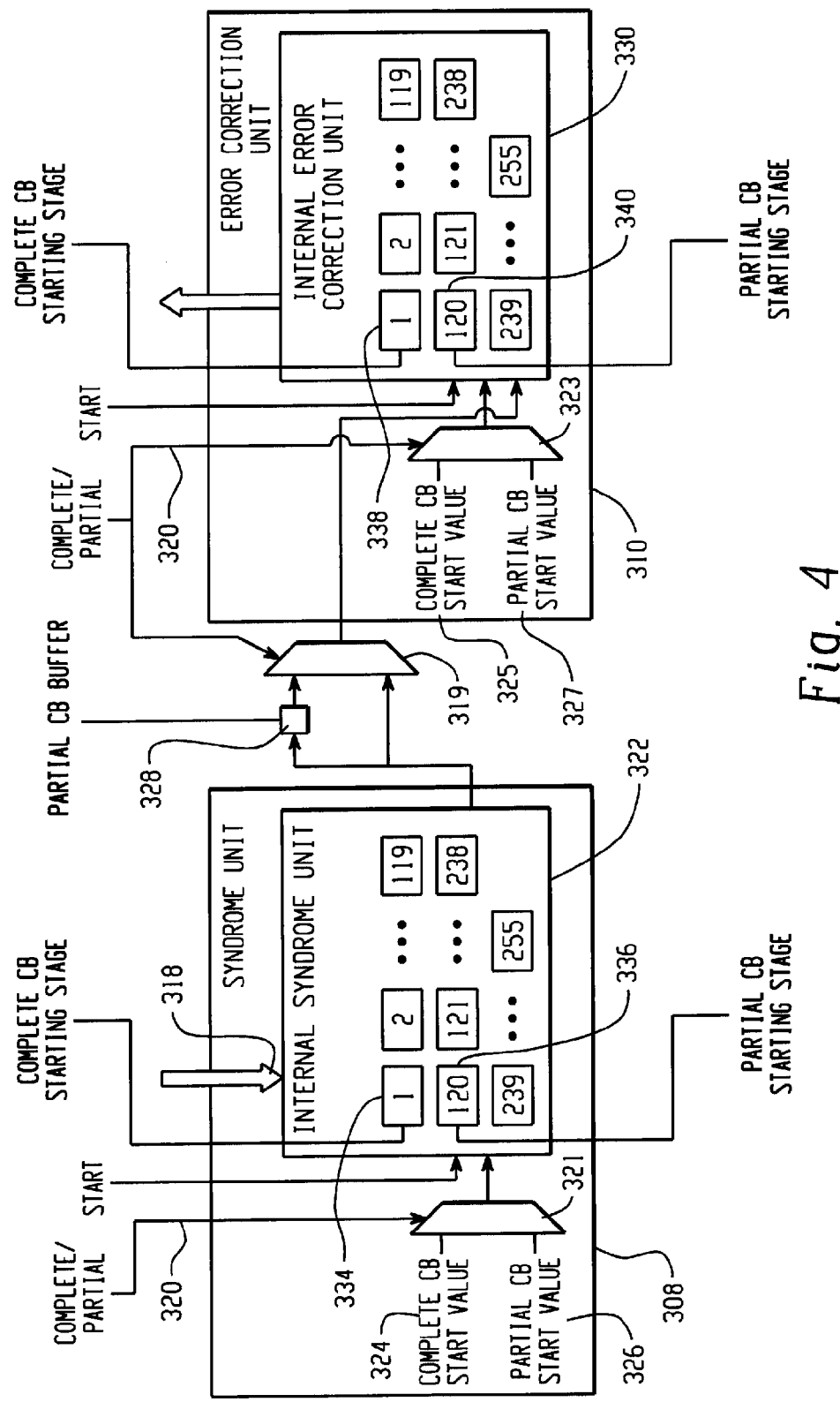
FIG. 4 is a diagram of an example syndrome unit and an example error correction unit of FIG. 3, in accordance with an embodiment of the disclosure.

FIG. 4 is a diagram of an example syndrome unit 308 and an example error correction unit 310 of FIG. 3, in accordance with an embodiment of the disclosure. As seen in FIG. 4, the internal syndrome unit 322 and the internal error correction unit 330 each include a plurality of processing stages that correspond to terms of a polynomial representing a code block. In accordance with an embodiment, each of processing stages is formed of hardware circuitry. Different stages within the internal syndrome unit 322 and the internal error correction unit 330 are used to process the incoming code block 318 depending on whether the code block 318 is a complete code block or a partial code block.

In operation, when the code block 318 is determined to be a complete code block, for example at the control unit 302 in an embodiment, the multiplexer 321 provides the complete code block start value 324 to the internal syndrome unit 322 which also receives the code block 318. In an embodiment, the complete code block start value 324 is zero, or another suitable start value. The code block 318 is input into the stages of the internal syndrome unit 322 starting at a beginning stage 334 (e.g., stage "1"). The syndrome values of the code block 318 which is determined to be a complete code block are calculated using all stages within the internal syndrome unit 322, where the result of processing at each stage is passed to a next stage. In response to the mode selection signal 320, the multiplexer 319 receives the calculated syndrome values of the code block 318 from the internal syndrome unit 322, and outputs the syndrome values to the internal error correction unit 330. The internal error correction unit 330 also receives the complete code block start value 325 from the multiplexer 323. The syndrome values are input into the stages of the internal error correction unit 330 starting at a beginning stage 338 (e.g., stage "1"). Error correction for the code block 318 which is determined to be a complete code block is carried out using all stages within the internal error correction unit 330, where the result of processing at each stage is passed to a next stage.

On the other hand, when the code block 318 is determined to be a partial code block, for example at the control unit 302 in an embodiment, the internal syndrome unit 322 receives the partial code block start value 326, which is different from the complete code block start value 324 in an embodiment, from the multiplexer 321 as well as the partial code block 318. The code block 318 is input into the stages of the internal syndrome unit 322 starting at an intermediate stage 336 (e.g., stage "120"), although the partial code block 318 may be suitably provided to a different stage in accordance with different standards, different code block structures, and the like. The syndrome values for the code block 318 are calculated based on the code block 318 and the partial code block start value 326. As the partial code block 318 is processed using fewer stages of the internal syndrome unit 322, the calculated syndrome values of the partial code block 318 are stored in the partial code block buffer 328 in order to maintain synchrony between syndrome values calculated for complete code blocks and syndrome values for partial code blocks. In an embodiment, in response to the mode selection signal 320, the multiplexer 319 selects either buffered syndrome values for a partial code block from the partial code block buffer 328 or syndrome values for a complete code block from the internal syndrome unit 322. As the code block 318 is determined to be a partial code block, the multiplexer 319 provides the syndrome values for the code block 318 stored in the partial code block buffer 328 to the internal error correction unit 330. The syndrome values are input into the stages of the internal error correction unit 330 staring at an intermediate stage 340 (e.g., stage "120"), although the syndrome values may be suitably provided to a different stage in accordance with different standards, different code block structures, and the like. Based on these syndrome values and the partial code block start value 327 received from the multiplexer 323, the internal error correction unit 330 performs error correction for the partial code block 318 using fewer stages than for a complete code block.

Figure 5:
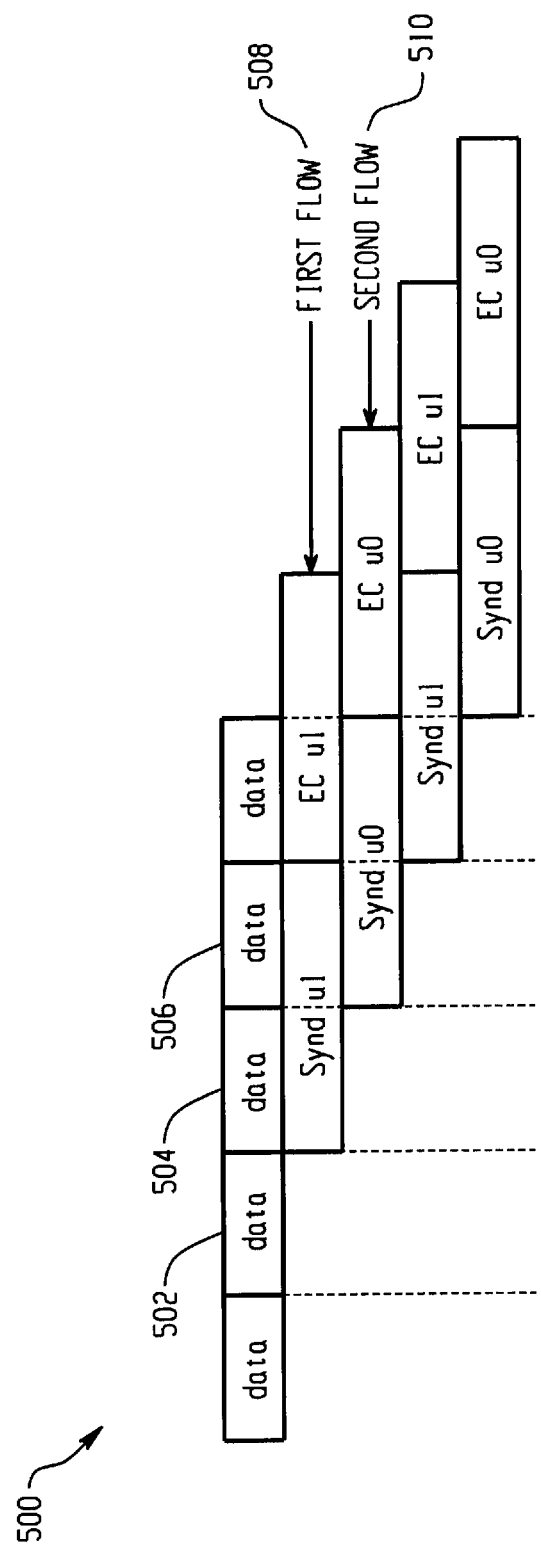
FIG. 5 is an example timing diagram for processing a sequence of complete code blocks using the decoder of FIG. 3.

FIG. 5 is an example timing diagram 500 for processing a sequence of complete code blocks using the decoder 300 of FIG. 3. Cross referencing FIG. 3 and FIG. 5, the decoding units 304 and 306 are selected alternately to process the sequence of complete code blocks. The syndrome unit 314 (e.g., "Synd u1") and the error correction unit 316 (e.g., "EC u1") of the decoding unit 306 is used in a first flow 508. The syndrome unit 308 (e.g., "Synd u0") and the error correction unit 310 (e.g., "EC u0") of the decoding unit 304 is used in a second flow 510.

The decoding unit 306 is selected to process a complete code block 502. The syndrome unit 314 receives the code block 502, and calculates syndrome values for the code block 502. The error correction unit 316 receives the calculated syndrome values from the syndrome unit 314 and performs error correction for the code block 502. When a complete code block 504 that follows the code block 502 arrives, the decoding unit 306 is still processing the code block 502. Then the decoding unit 304 is selected instead to process the code block 504. The syndrome unit 308 receives the code block 504 and calculates syndrome values for the code block 504. The error correction unit 310 receives the calculated syndrome values from the syndrome unit 308 and perform error correction for the code block 504. When another complete code block 506 that follows the code block 504 arrives, the syndrome unit 314 has finished processing the code block 502, and begins to process the code block 506. As such, the sequence of complete code blocks in a GPON frame are processed alternately by the decoding units 304 and 306.

In an embodiment, the partial code block buffer 328 included in the decoding unit 304, and the partial code block buffer 348 included in the decoding unit 306 introduce a delay so that the processing time of a partial code block is the same as a complete code block, which enables processing of the code blocks to be interleaved.

Figure 6A:
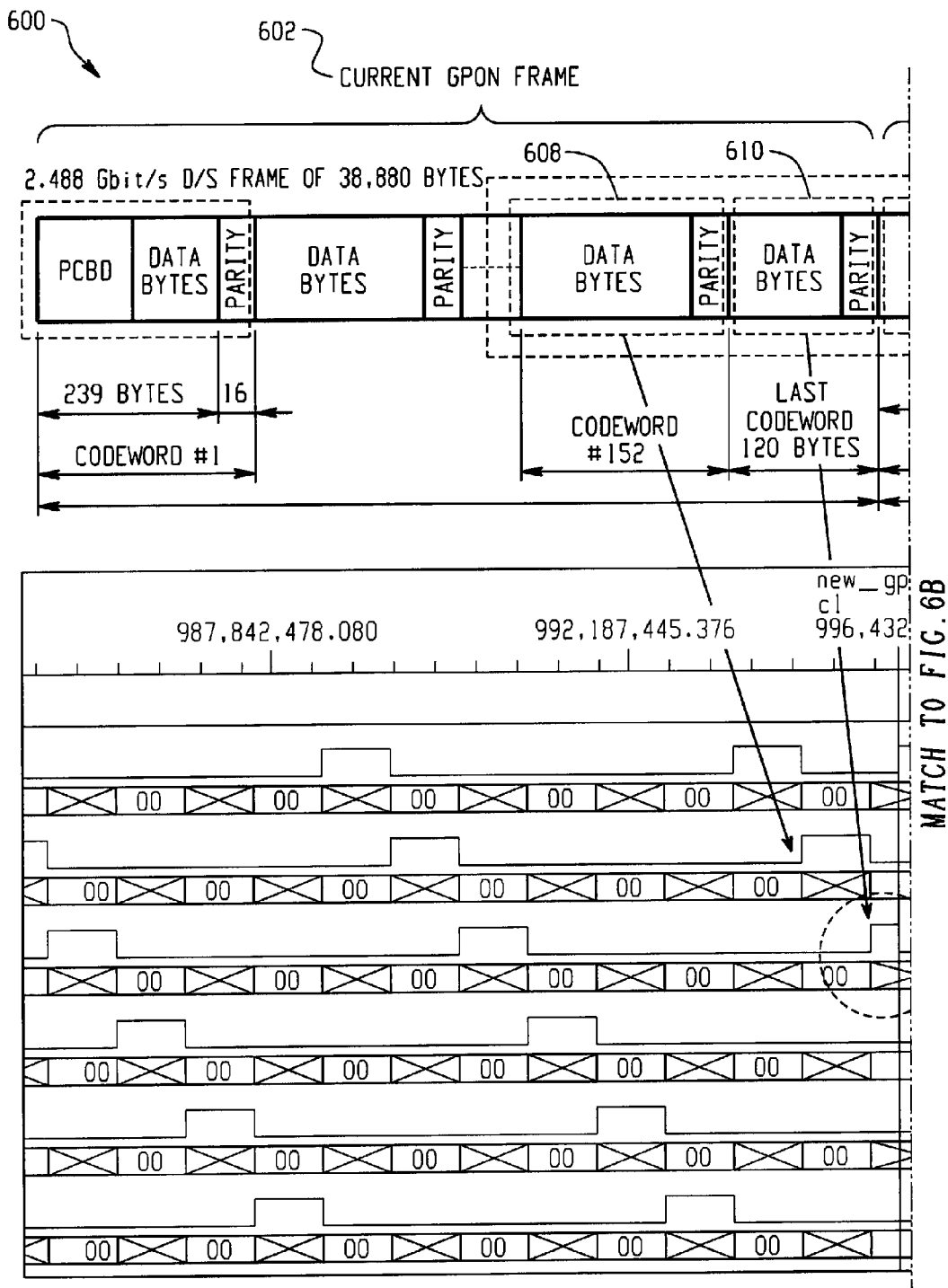
FIGS. 6A-6B are diagrams of an example special sequence of code blocks of two back-to-back GPON frames, in accordance with an embodiment of the disclosure.
Figure 6B:
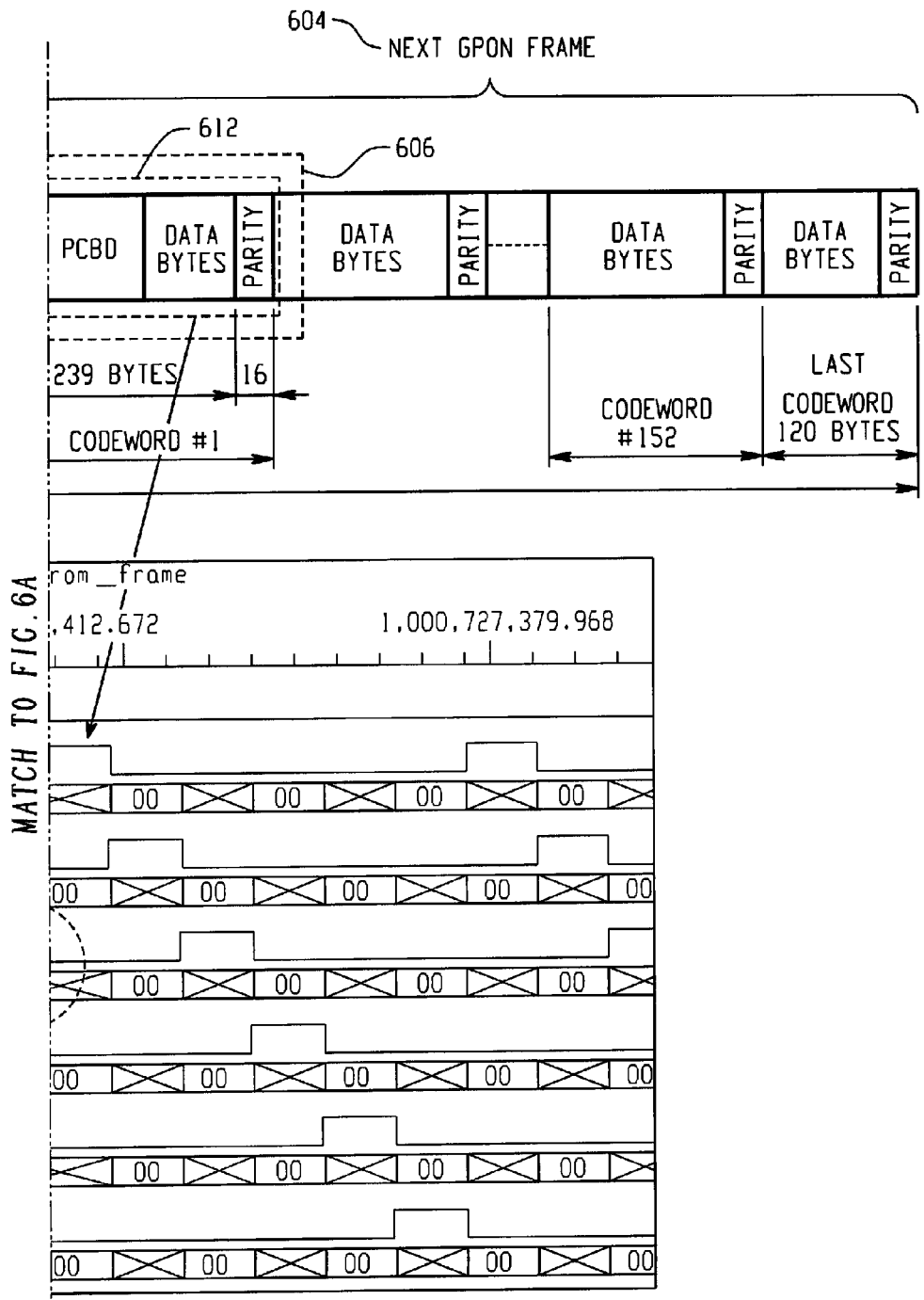

Usually, GPON frames are transmitted consecutively in a GPON data stream. Consequently, the decoder 300 often needs to process a special sequence of code blocks when receiving two back-to-back GPON frames. FIGS. 6A and 6B show at 600 a diagram of an example special sequence of code blocks of two back-to-back GPON frames. A GPON frame 602 is followed by another GPON frame 604. A special sequence of code blocks 606 appears, including three code blocks 608, 610, and 612. The code blocks 608 and 610 are the last two blocks of the GPON frame 602, and the code block 612 is the first code block of the GPON frame 604. The code blocks 608 and 612 are complete code blocks each including 255 bytes of data, while the code block 610 is a partial code block including 120 bytes of data, only.

Figure 7:
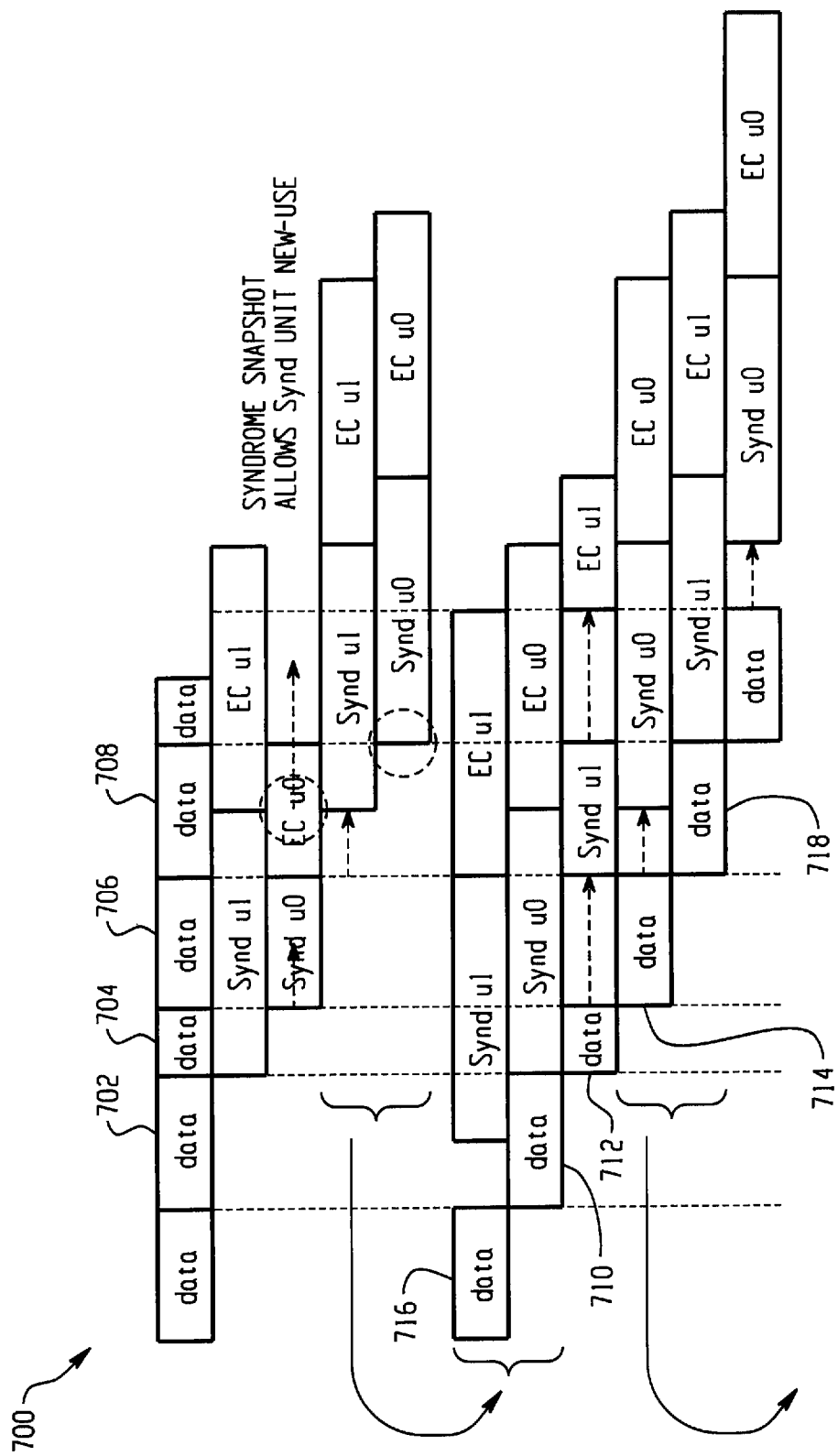
FIG. 7 is an example timing diagram for processing special sequences of code blocks using the decoder in FIG. 3.

FIG. 7 is an example timing diagram for processing special sequences of code blocks using the decoder 300 in FIG. 3. Cross referencing FIG. 3 and FIG. 7, the decoder 300 switches between two operating modes to process the special sequences of code blocks. A first special sequence of code blocks include code blocks 702, 704 and 706, where the code block 704 is the last code block of a previous GPON frame, and the code block 706 is the first code block of a current GPON frame.

In operation, the syndrome unit 314 (e.g., "Synd u1") and the error correction unit 316 (e.g., "EC u1") of the decoding unit 306 is used in a first flow, and the syndrome unit 308 (e.g., "Synd u0") and the error correction unit 310 (e.g., "EC u0") of the decoding unit 304 is used in a second flow. The syndrome unit 314 (e.g., "Synd u1") receives the code block 702 and calculates syndrome values for the code block 702. The multiplexer 319 receives the syndrome values for the code block 702 from the syndrome unit 314, and provides the syndrome values to the error correction unit 316 (e.g., "EC u1") that performs error correction for the code block 702. When the partial code block 704 that follows the code block 702 arrives, the syndrome unit 308 (e.g., "Synd u0") receives the partial code block 704, and calculates syndrome values for the partial code block 704. The calculated syndrome values for the partial code block 704 is stored in the partial code block buffer 328, and the syndrome unit 308 can already be used by subsequent code blocks (e.g., code block 708). After a predetermined delay, the multiplexer 319 receives the syndrome values for the partial code block 704 from the buffer 328, and provides the syndrome values to the error correction unit 310 (e.g., "EC u0") that performs error correction for the code block 704.

When the code block 706 arrives, the syndrome unit 314 has not yet finished processing the code block 702. After a latency, the syndrome unit 314 begins processing the code block 706. The latency will affect subsequent code blocks that are to be processed by the syndrome unit 314 and the error correction unit 316, until the second special sequence of code blocks arrive. On the other hand, when the code block 708 that follows the code block 706 arrives, the syndrome unit 308 is ready and begins processing the code block 708 without any latency. Because the code block 708 is a complete code block, the multiplexer 319 receives the syndrome values for the code block 708 from the syndrome unit 308, and provides the syndrome values to the error correction unit 310 for error correction. There is no latency for the syndrome unit 308 and the error correction unit 310 to process subsequent code blocks, until a second special sequence of code blocks arrive.

The second special sequence of code blocks arrives at the end of the current GPON frame, and includes code blocks 710, 712, and 714. The code block 712 is the last code block of the current GPON frame, and is a partial code block. Based on the known structure of the current GPON frame, the code block 712 is to be processed by the syndrome unit 314 (e.g., "Synd u1") and the error correction unit 316 (e.g., "EC u1"). When the code block 712 arrives, however, the syndrome unit 314 is still processing a previous code block 716. After a prolonged latency, the syndrome unit 314 begins processing the code block 712.

When the code block 714 that follows the code block 712 arrives, the syndrome unit 308 has not finished processing the code block 710. After a latency, the syndrome unit 308 begins processing the code block 714. The latency will affect the subsequent code blocks that are processed by the syndrome unit 308 and the error correction unit 310, until a next special sequence of code blocks arrive. On the other hand, when a code block 718 that follows the code block 714 arrives, the syndrome unit 314 is ready and processes the code block 718 without any latency. The syndrome unit 314 and the error correction unit 316 do not suffer a latency for processing subsequent code blocks, until the next special sequence of code blocks arrive.

Similarly, the next special sequence of code blocks causes a new latency for the syndrome unit 314 and the error correction unit 316, while removing the existing latency for the syndrome unit 308 and 310. Thus, the decoder 300 limits the latency caused by the special sequences of code blocks of back-to-back GPON frames to a certain extent, so that the latency does not become too long for the decoder 300 to function properly.

Figure 8:
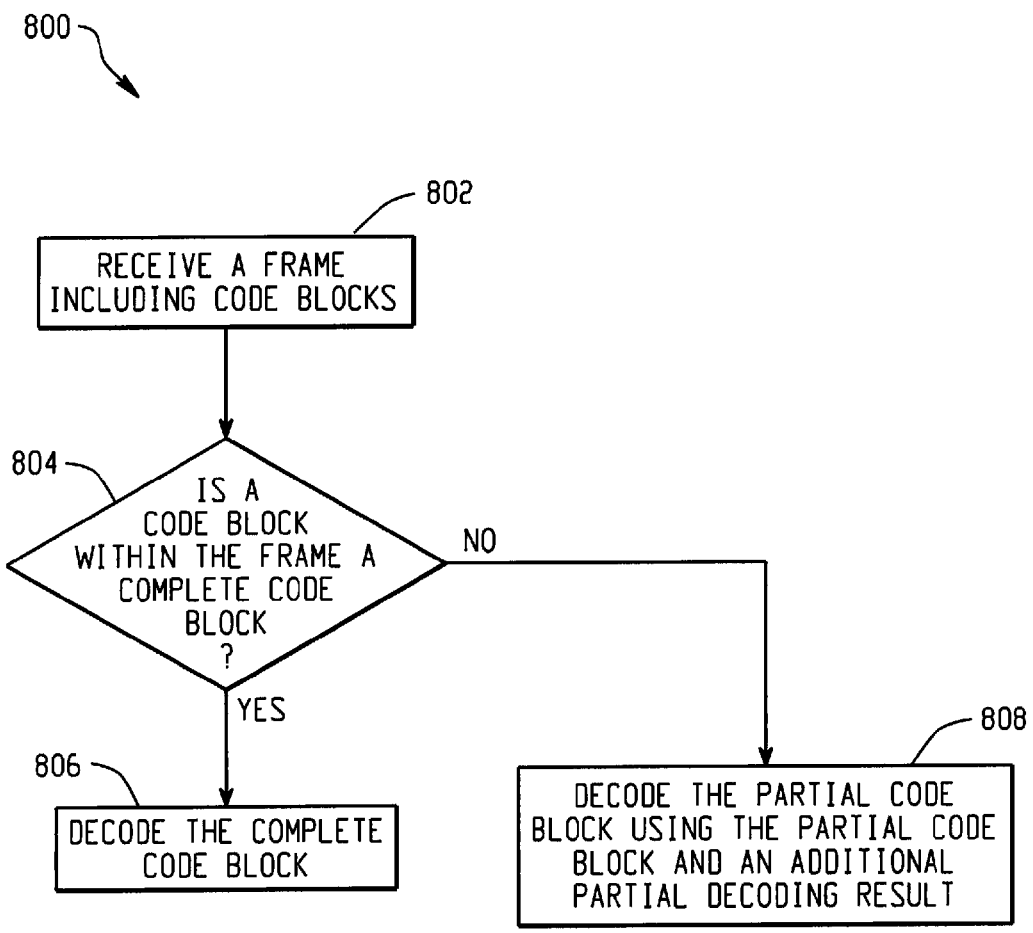
FIG. 8 is an example flow chart for performing forward error correction for a frame in a data stream, in accordance with an embodiment of the disclosure.

FIG. 8 is an example flow chart for performing forward error correction for a frame in a data stream, in accordance with an embodiment of the disclosure. A frame including a plurality of code blocks is received at 802. Whether a code block within the frame is a complete code block is determined at 804. If the code block is a complete code block, then the complete code block is decoded at 806. If the code block is a partial code block, then the code block is decoded based on the code block and an additional partial decoding result at 808. The additional partial decoding result corresponds to a result of decoding a certain number of zeros as if the zeros had been padded into the incoming code block to form the intermediate complete code block to be decoded.

This written description uses examples to disclose the invention, include the best mode, and also to enable a person skilled in the art to make and use the invention. The patentable scope of the invention may include other examples that occur to those skilled in the art.

The invention claimed is:

1. A decoder for performing forward error correction for a frame in a data stream, said decoder comprising:
    a state machine configured to determine if a code block within the frame received by the decoder is a complete code block or a partial code block, the frame including a plurality of code blocks; and
    a decoding unit configured to receive the code block, and, when the code block is a partial code block, to generate an output based on decoding the partial code block and an additional partial decoding result that is input to the decoding unit.

2. The decoder of claim 1, wherein the decoding unit is further configured, when the code block is a complete code block, to generate an output based on decoding the complete code block.

3. The decoder of claim 1, wherein the decoding unit includes a plurality of stages, each stage corresponding to a term of a polynomial representing the code block.

4. The decoder of claim 3, wherein when the code block is determined to be a complete code block, the decoding unit is configured to input the code block to the plurality of stages starting at a beginning stage of the plurality of stages.

5. The decoder of claim 3, wherein when the code block is determined to be a partial code block, the decoding unit is configured to input the code block to the plurality of stages starting at an intermediate stage of the plurality of stages, the intermediate stage being determined based on a pre-determined structure of the code block.

6. The decoder of claim 1, wherein the decoding unit comprises:
    a syndrome component configured to receive the code block, and to generate syndrome values of the code block, the syndrome component including a first plurality of stages, each of the first plurality of stages corresponding to a term of a polynomial representing the code block; and
    an error correction component configured to receive the syndrome values, and to determine whether the code block contains an error based on the syndrome values, the error correction component including a second plurality of stages, each of the second plurality of stages corresponding to a term of the polynomial representing the code block.

7. The decoder of claim 6, wherein when the code block is determined to be a complete code block, the syndrome component is configured to input the code block to the first plurality of stages starting at a beginning stage of the first plurality of stages.

8. The decoder of claim 6, wherein when the code block is determined to be a partial code block, the syndrome component is configured to input the code block to the first plurality of stages starting at an intermediate stage of the first plurality of stages, the intermediate stage being determined based on a pre-determined structure of the code block.

9. The decoder of claim 6, wherein when the code block is determined to be a complete code block, the error correction component is configured to input the syndrome values of the code block to the second plurality of stages starting at a beginning stage of the second plurality of stages.

10. The decoder of claim 6, wherein when the code block is determined to be a partial code block, the error correction component is configured to input the syndrome values of the code block to the second plurality of stages starting at an intermediate stage of the second plurality of stages, the intermediate stage being determined based on a pre-determined structure of the code block.

11. The decoder of claim 6, wherein the decoding unit further comprises:
    a buffer configured to receive the syndrome values from the syndrome component when the code block is determined to be a partial code block.

12. The decoder of claim 11, wherein the error correction component is configured to receive the syndrome values directly from the syndrome component when the code block is determined to be a complete code block; and
    wherein the error correction component is configured to receive the syndrome values from the buffer after a pre-determined delay when the code block is determined to be a partial code block.

13. The decoder of claim 1, wherein the state machine is further configured to determine if the code block is a complete code block or a partial code block based at least in part on a pre-determined structure of the frame and a location of the code block within the frame.

14. The decoder of claim 13, wherein the state machine is further configured to determine if the code block is a complete code block or a partial code block based at least in part on the number of bytes of original data for transmission contained in the code block.

15. The decoder of claim 14, wherein the code block is determined to be a complete code block when the code block contains 239 bytes of the original data for transmission, or to be a partial code block when the code block contains 104 bytes of the original data for transmission.

16. A method for performing forward error correction for a frame of a data stream, said method comprising:
   receiving the frame that includes a plurality of code blocks;
   determining, using a state machine, for each of the plurality of the code blocks whether a code block is a complete code block or a partial code block; and
   decoding the code block in a decoder based on the determination, wherein when the code block is determined to be a partial code block, an output is generated based on decoding the partial code block and an additional partial decoding result that is input to the decoder.

17. The method of claim 16, wherein when the code block is determined to be a complete code block, an output is generated based on decoding the entire code block.

18. The method of claim 16, wherein decoding the code block in the decoder based on the determination comprises:
   generating syndrome values for the code block; and
   performing error correction for the code block based on the generated syndrome values.

19. The method of claim 18, wherein when the code block is determined to be a partial code block, the error correction for the code block is performed after a predetermined delay.

20. The method of claim 16, wherein the determination of whether the code block is a complete code block or a partial code block is based at least in part on a pre-determined structure of the frame and a location of the code block within the frame.

* * * * *